United States Patent
Henstra et al.

(10) Patent No.: US 11,239,045 B1
(45) Date of Patent: Feb. 1, 2022

(54) METHOD AND SYSTEM FOR CORRECTING TWO-FOLD, FIFTH-ORDER PARASITIC ABERRATIONS IN CHARGED PARTICLE SYSTEMS

(71) Applicant: FEI Company, Hillsboro, OR (US)

(72) Inventors: Alexander Henstra, Eindhoven (NL); Marcel Niestadt, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/039,478

(22) Filed: Sep. 30, 2020

(51) Int. Cl.
  *H01J 37/153* (2006.01)
  *H01J 37/28* (2006.01)
  *H01J 37/145* (2006.01)

(52) U.S. Cl.
  CPC .......... *H01J 37/153* (2013.01); *H01J 37/145* (2013.01); *H01J 37/28* (2013.01); *H01J 2237/1534* (2013.01)

(58) Field of Classification Search
  CPC ........ H01J 37/153; H01J 37/145; H01J 37/28; H01J 2237/1534
  See application file for complete search history.

(56) References Cited

U.S. PATENT DOCUMENTS

| | | | |
|---|---|---|---|
| 2003/0111613 A1* | 6/2003 | Rose | B82Y 10/00 250/396 R |
| 2006/0219935 A1* | 10/2006 | Henstra | H01J 37/153 250/396 ML |
| 2008/0128635 A1* | 6/2008 | Sawada | H01J 37/26 250/396 R |
| 2009/0101818 A1* | 4/2009 | Zach | H01J 37/28 250/311 |
| 2010/0072387 A1* | 3/2010 | Sawada | H01J 37/153 250/396 ML |
| 2012/0119107 A1* | 5/2012 | Sawada | H01J 37/153 250/396 ML |
| 2013/0264477 A1* | 10/2013 | Martin | H01J 37/145 250/307 |
| 2018/0190469 A1* | 7/2018 | Cheng | H01J 37/141 |

\* cited by examiner

*Primary Examiner* — Sean M Luck

(57) ABSTRACT

Correctors for correcting two-fold, fifth-order parasitic aberrations in charged particle systems according to the present disclosure include a first corrective component that generates a first quadrupole field when a first excitation is applied to the first corrective component, and a second corrective component that generates a second quadrupole field when a second excitation is applied to the second corrective component. Correctors according to the present disclosure also include a quadrupole positioned between the second corrective component and the sample when used in the charged particle microscope system that generates a third quadrupole field. The third quadrupole field, in combination with at least the first quadrupole field and the second quadrupole field, corrects the fifth-order, two-fold aberrations when the charged particle microscope is in use.

20 Claims, 4 Drawing Sheets

METHOD AND SYSTEM FOR CORRECTING TWO-FOLD, FIFTH-ORDER PARASITIC ABERRATIONS IN CHARGED PARTICLE SYSTEMS

BACKGROUND OF THE INVENTION

Particle-optical microscopes utilize round lenses to direct electron/charged particle beams to irradiate a specimen. However, round lenses generate positive spherical aberration coefficients that restrict higher opening angles and inhibit resolution and probe current. To address this issue, current particle-optical microscopes incorporate multipole correctors to reduce and/or correct spherical aberrations. Using current corrector systems, all aberrations up to order five can be zeroed/corrected except for the parasitic two-fold, fifth-order aberration.

Accordingly, this two-fold, fifth-order aberration is a fundamental barrier that limits the imaging capabilities of current charged particle-optical microscopes, especially for half opening angles greater than 40 mrad. Accordingly, there is a desire to reduce the parasitic two-fold, fifth-order aberration to allow charged particle systems to operate with enhanced resolution in this regime.

SUMMARY OF THE INVENTION

Spherical aberration correctors which also correct for parasitic two-fold, fifth-order parasitic aberrations in charged particle systems according to the present disclosure include a first corrective component that generates a first quadrupole field when a first excitation is applied to the first corrective component, and a second corrective component that generates a second quadrupole field when a second excitation is applied to the second corrective component. The second corrective component is positioned between the first corrective component and a sample when used in the charged particle microscope system. The correctors according to the present disclosure also include a third quadrupole positioned between the second corrective component and the sample when used in the charged particle microscope system that generates a third quadrupole field. The third quadrupole field, in combination with at least the first quadrupole field and the second quadrupole field, corrects the fifth-order, two-fold aberrations when the charged particle microscope is in use.

Charged particle microscope systems according to the present disclosure include a sample holder configured to hold a sample, an emitter configured to emit a charged particle beam toward the sample, and a focusing column configured to focus the charged particle beam onto the sample. The charged particle microscope systems further include a spherical aberration corrector and an S5 corrector for correcting two-fold, fifth-order parasitic aberrations in charged particle systems. The S5 corrector is positioned between the spherical aberration corrector that generates a negative $C_S$ and an objective lens that generates a positive $C_S$ when used in a charged particle microscope system. These two correctors comprise a first corrective component and a second corrective component that each generate quadrupole fields when excitations are applied thereto. The S5 corrector includes a quadrupole positioned between the second corrective component and the sample when used in the charged particle microscope system that generates a third quadrupole field that, in combination with the first and second quadrupole fields, corrects the fifth-order, two-fold aberrations when the charged particle microscope is in use, without affecting 2-fold aberrations of lower order. In some embodiments, each of the first and/or second corrective component are component elements of the spherical aberration corrector. Alternatively, in some embodiments the first corrective component may be a component portion of the spherical corrector and the second corrective component may be positioned between the spherical corrector and the quadrupole element.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
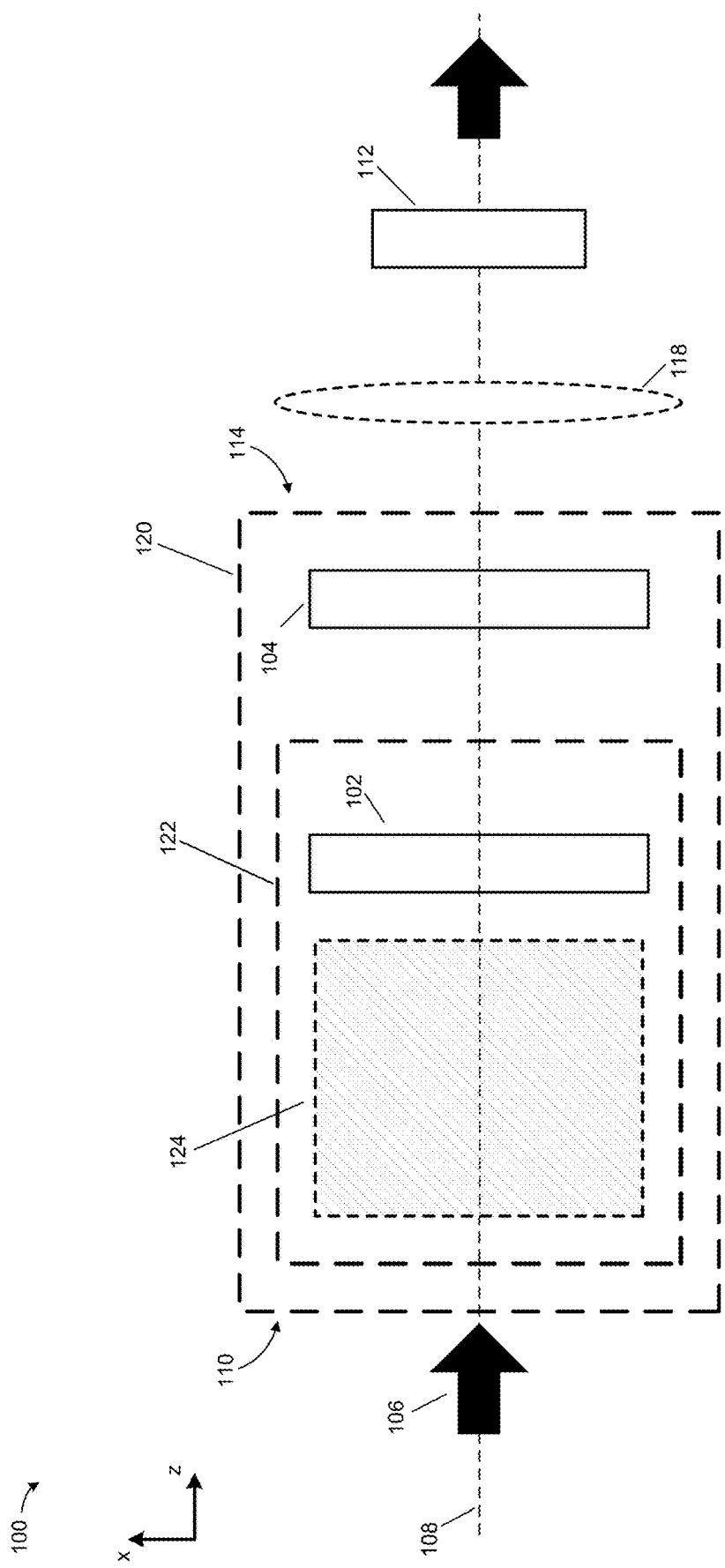
FIG. 1 illustrates example corrector systems for correcting the two-lobe, fifth-order aberration $S_5$, according to the present invention.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Corrector systems for correcting the parasitic two-fold, fifth order aberration as well as their methods for operation are included herein. More specifically, the corrector systems disclosed herein use a quadrupole lens positioned and/or otherwise configured to correct the fifth-order two-lobe $S_5$ aberration in charged particle microscope systems. The quadrupole lens is positioned between the spherical aberration corrector that generates a negative $C_S$ and an objective lens that generates a positive $C_S$ when used in a charged particle microscope system. In many implementations, the parasitic two-fold, fifth order aberration may be at least partially caused by mechanical errors in such a spherical aberration corrector.

In some embodiments of corrector systems according to the present invention, the quadrupole lens is positioned at an axial crossover of the charged particle beam when used in a charged particle microscope system. For example, the quadrupole lens may be a component of the transfer optics of a charged particle microscope system. In such embodiments, the quadrupole lens is excited such that the quadrupole field it generates corrects for the two-fold, fifth order aberration.

In other embodiments of the present invention, the quadrupole lens is not positioned at an axial crossover of the charged particle beam when used in a charged particle microscope system. In such embodiments, the corrector systems include a pair of corrective components that each generate a quadrupole field when excitations are applied thereto, and the quadrupole is positioned between one of the corrective components and the sample when used in the charged particle microscope system. A first component that generates a first quadrupole field may be a separate element adjacent to the corrector, or may be a component multipole or the corrector that is closest to the sample. For example, for a quadrupole-octupole corrector the multipole closest to the sample may already generate a quadrupole field, in such situations the first quadrupole is an additional quadrupole field generated by this multipole (typically with a different orientation). In another example, in a hexapole corrector, the main hexapole closest to the sample can be used as such a first component, with the charged particle beam being sent slightly off-axis through this hexapole, thus mimicking the effect of a quadrupole field (i.e., effectively acting as a stigmator).

In addition to affecting the two-fold, fifth-order two-lobe $S_5$ aberration, the field generated by the quadrupole lens also affects the two-fold, first-order aberration $A_1$ and the two-fold, third-order aberration $S_3$ when the lens is not positioned in an axial crossover of the beam. This allows the first corrective component and the second corrective component to be selectively positioned, excited, and/or otherwise configured so that they each generate two-fold, first-order aberrations $A_1$, two-fold, third-order aberrations $S_3$, and two-fold, fifth-order aberrations $S_5$, that counterbalances, eliminates, and/or otherwise corrects the $A_1$, $S_3$, and $S_5$ aberrations in the system. Specifically, the first corrective component and the second corrective component may be selectively positioned, excited, and/or otherwise configured so that the field(s) they generate create $A_1$ and $S_3$ aberrations that counterbalance the $A_1$, and $S_3$ aberrations that are generated by the quadrupole lens when it is not positioned at an axial crossover point. In this way, the combined effect of the three quadrupole fields is a generation of only an $S_5$ aberration, which is tuned such that it counterbalances the parasitic $S_5$ generated within a charged particle system (e.g., generated by a Cs-corrector plus an objective lens).

In some embodiments, the pair of corrective components may be component parts of a spherical aberration corrector. Alternatively, in other embodiments the at least a pair of corrective components may correspond to a first corrective component may be a component of such a spherical aberration corrector, and a second corrective component may be positioned between the spherical aberration corrector and the quadrupole lens. Moreover, in some of these embodiments the quadrupole lens may be an extension (i.e., a component of) such a spherical aberration corrector. The quadrupole lens generates a third quadrupole field that, in combination with the first and second quadrupole fields, corrects the fifth-order, two-fold aberrations when the charged particle microscope is in use.

Correcting an aberration according to the present disclosure corresponds to a positive aberration being counterbalanced by a negative aberration such that their sum is zeroed, substantially zeroed, and/or reduced to an optimal value (e.g., reduced to a value such that their sum combines with one or more other aberrations to balance/correct for higher-order aberrations). Moreover, the terms multipole, quadrupole, hexapole, quadrupole-octupole etc. are used herein to describe multipole fields, quadrupole fields, hexapole fields, quadrupole-octupole fields, etc., and not the physical devices configured to generate those fields.

FIG. 1 is an illustration of example corrector systems 100 for correcting the two-lobe, fifth-order aberration $S_5$, according to the present invention. The description and arrows in FIG. 1 are specific for a probe corrector in a SEM or STEM system. Example multipole correctors 100 include at least a corrective component 102 and a second corrective component 104. The corrective components are each optical elements for generating an electromagnetic field (e.g., a rotatable quadrupole fields) when an excitation is applied thereto, such as a multipole, a stigmator, etc. As used herein, the term "excitation" as applied to a multipole refers to an excitation voltage or an excitation current being applied to the corresponding multipole. For example, in an embodiment where the corrector 100 is being used in an electron microscope column, the excitation may refer to a current that is applied to a particular multipole which causes the particular multipole to generate a multipole field.

A multipole is an optical element showing n/2-fold rotational symmetry, where n is an even integer. Thus, examples of multipoles include dipoles, quadrupoles, hexapoles, etc. For example, a multipole with 8 yokes/electrodes can generate dipole fields, quadrupole fields, and hexapole fields, in any orientation. In some embodiments one or both of the corrective components may be two-fold stigmators (also known as quadrupole lenses).

During operation of the SEM or STEM system, a charged particle beam 106 is directed along a central axis 108 toward a first end 110 of the corrector systems 100. The second corrective component 104 is located between the first corrective component 102 and a particle-optical lens when the corrector is used within a charged particle microscope system. For example, the second corrective component 104 is shown in FIG. 1 as being located downstream of the first corrective component 102 (i.e., the charged particle beam 106 interacts with the first corrective component 102 before it interacts with the second corrective component 104). However, persons having skill in the art will understand that in embodiments where the corrector system 100 is designed for operation within a TEM system, the corrector 100 would be positioned downstream of the sample, and the path of the charged particle beam 108 as shown in FIG. 1 be reversed (i.e., it would interact with the second corrective component 104 before interacting with the first corrective component 102. In some embodiments, one or more optical components (e.g., lenses, multipoles, other corrector components, etc.) may be positioned between the first corrective component 102 and second first corrective component 104. Alternatively, in some embodiments no components may be present between the first corrective component 102 and second first corrective component 104. An excitation is applied to each of the first corrective component 102 and the second corrective component 104 such that they generate an electromagnetic field that directs the charged particle beam 106 so that is incident upon a specimen.

In some embodiments, the first corrective component 102 and the second corrective component 104 are each component elements of a spherical aberration corrector. Optional first spherical aberration corrector system 120 is shown in FIG. 1 to illustrate such embodiments, where the first corrective component 102 and the second corrective component 104 components positioned within the optional spherical aberration corrector system 120. Alternatively, in some embodiments the first corrective component 102 may be a component element of a spherical aberration corrector while the second corrective component 104 is positioned downstream of the spherical aberration corrector. Optional second spherical aberration corrector system 122 is shown in FIG. 1 to illustrate such embodiments. In yet further embodiments according to the present invention, each of the first corrective component 102 and the second corrective component 104 may be positioned between a spherical aberration corrector and the sample when used in a charged particle system. Optional third spherical aberration corrector system 124 is shown in FIG. 1 to illustrate such embodiments.

According to the present invention, the contributions of the first corrective component 102, the second corrective component 104, and the transfer optics in between (including the third quadrupole field) at least partially produce a significant two-fold, fifth-order two-lobe $S_5$ aberration. Moreover, the contributions of the first corrective component 102, the second corrective component 104, and the transfer optics in between may also at least partially produce a two-fold, first-order aberration $A_1$ and a two-fold, third-order aberration $S_3$.

FIG. 1 further shows the example corrector systems 100 as including a quadrupole lens 112 positioned between the second corrective component 104 and a sample when the corrector system 100 is used within a charged particle microscope system (e.g., downstream of the second corrective component 104 in a SEM/STEM system, and upstream of the second corrective component 104 in a TEM system). The quadrupole lens 112 is positioned between a spherical corrector with negative Cs and an objective lens with positive Cs. The quadrupole lens 112 is positioned, excited, and/or otherwise configured so that a multipole field generated by the quadrupole lens 112 corrects the two-fold, fifth-order two-lobe $S_5$ aberration at least partially generated by the first corrective component 102, the second corrective component 104, and the transfer optics in between. For example, where the quadrupole lens 112 is a two-fold, stigmator, it is positioned, excited, and/or otherwise configured so that a field generated by the quadrupole lens 112 acts as a positive lens in one axial direction and a negative lens in a perpendicular axial direction, such that the field corrects (i) the two-fold, fifth-order two-lobe $S_5$ aberration, and in some embodiments also corrects one or both of (ii) the two-fold, first-order aberration $A_1$ and the two-fold, third-order aberration $S_3$. Each of the quadrupole fields generated by the first corrective component 102, the second corrective component 104, and the quadrupole lens 112 have a contribution to the two-fold, first-order aberration $A_1$, the two-fold, third-order aberration $S_3$, two-fold, fifth-order two-lobe $S_5$ aberration. Thus, because the positioning and/or configuring of each of the first corrective component 102, the second corrective component 104, and the quadrupole lens 112 can be adjusted, a user has three degrees of freedom with which to position and/or configure these three elements such that the total contributions of the three components to the two-fold, first-order aberration $A_1$, the two-fold, third-order aberration $S_3$, two-fold, fifth-order two-lobe $S_5$ aberration combine to nullify each of the three aberrations.

In some embodiments, the quadrupole lens 112 is positioned at an axial crossover point of the charged particle beam 108. When positioned at an axial crossover point in this way, the excitation applied to the quadrupole lens 112 is able to be tuned such that the field it generates reduces, eliminates, and/or otherwise corrects the two-fold, fifth-order two-lobe $S_5$ aberration without introducing a significant effect on other aberrations. Specifically, when positioned at an axial crossover point, the field generated by the quadrupole lens 112 changes the effective drift space (i.e., causes a shortening of the drift space in a first plane parallel to the emission axis while causing a lengthening of the drift space in a second plane perpendicular to the first plane and also parallel to the emission axis) between the corrector exit plane 114 and the objective lens of such that the two-fold, fifth-order two-lobe $S_5$ aberration is reduced, eliminated, and/or otherwise corrected.

Alternatively, where the quadrupole lens 112 is not positioned at an axial crossover point of the charged particle beam 108, in addition to affecting the two-fold, fifth-order two-lobe $S_5$ aberration, the field generated by the quadrupole lens 112 also counterbalances, eliminates, and/or otherwise corrects for the two-fold, first-order aberration $A_1$ and the two-fold, third-order aberration $S_3$ in the example corrector systems 100. In such embodiments, the first corrective component 102, the second corrective component 104, and the quadrupole lens 112 are positioned, excited, and/or otherwise configured so that any $A_1$, $S_3$, and/ $S_5$ field(s) they individually generate combine to counterbalance, eliminate, and/or otherwise correct the $A_1$, $S_3$, and/or $S_5$ aberrations in the example corrector systems 100. The fields generated by the quadrupole lens 112 that is not positioned at an axial crossover point, the first corrective component 102, and the second corrective component 104 all have the same orientation in the xy-plane perpendicular to the emission axis 210. In such embodiments, the first corrective component 102 and the second corrective component 104 are positioned, excited, and/or otherwise configured so that the field(s) they generate cause a two-fold, first-order aberration $A_1$, and a two-fold, third-order aberration $S_3$, that counterbalances the first-order aberration $A_1$, and the two-fold, third-order aberration $S_3$, that are generated by the third quadrupole lens 112 not positioned at an axial crossover point. Thus, in such embodiments, the combined $S_5$ caused by each of the first corrective component 102, the second corrective component 104, and the quadrupole 112 counterbalances, eliminates, and/or otherwise corrects for the parasitic $S_5$ of the spherical aberration corrector.

In some embodiments, example corrector systems 100 may include an intermediate multipole 116 and/or one or more transfer lenses 118. In FIG. 1, multipole corrector 100 is illustrated as being a box comprising a plurality of optical components (i.e., multipoles and lenses). In various embodiments, these optical components may be encased or partially encased by a protective and/or supporting structure. Additionally, in embodiments including such a structure, one or more of the optical components may be not within the structure. FIG. 1 also shows at least one additional corrective component 120. Individual multipoles of the at least one additional multiple 102 may be positioned upstream from the first corrective component 102, downstream from the second corrective component 104, between the first corrective component 102 and the second corrective component 104, or a combination thereof.

Figure 2:
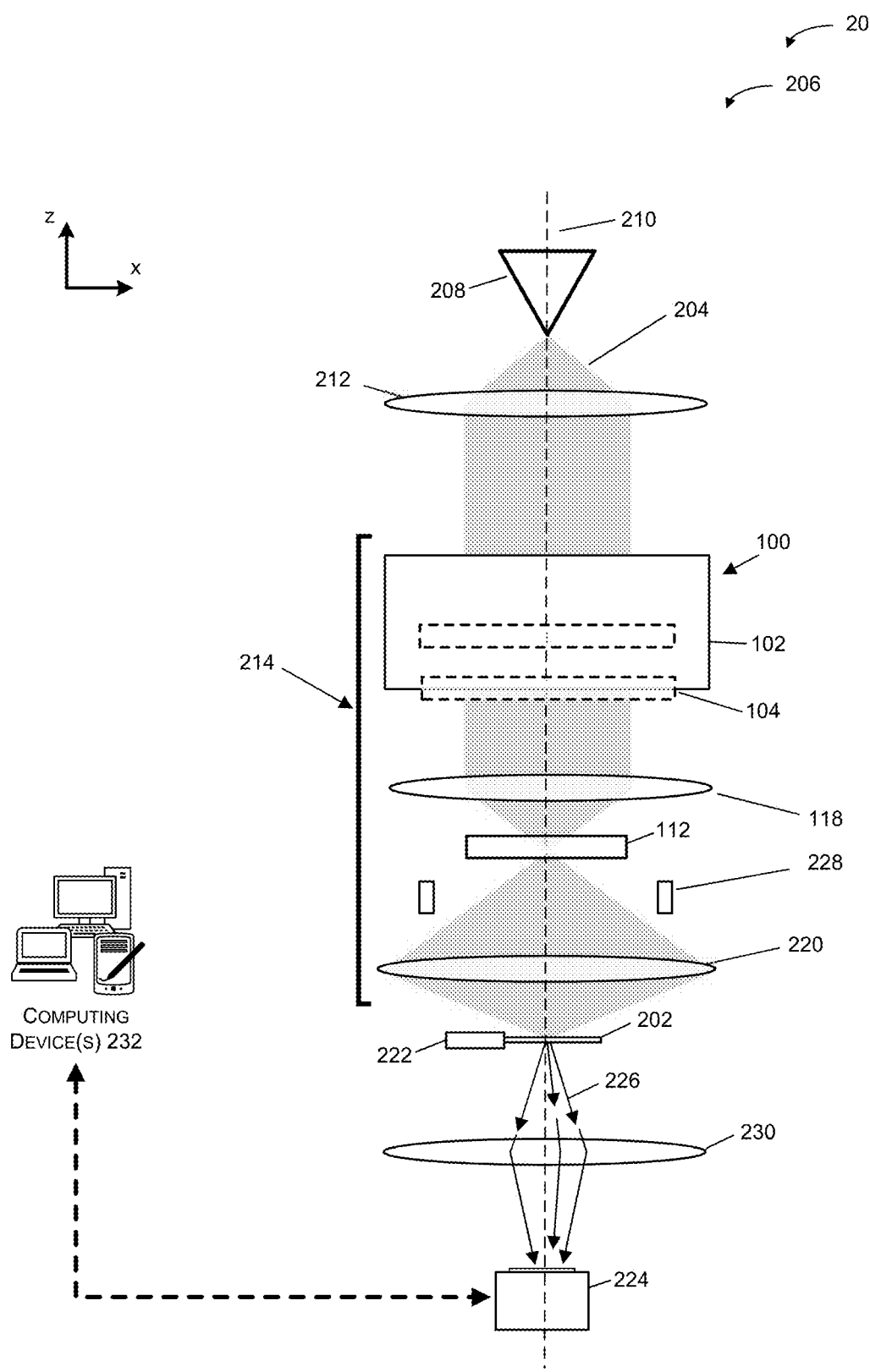
FIG. 2 illustrates example charged particle microscope systems for inspection of a component of a sample whose optical column includes a corrector system for correcting the two-fold, fifth-order aberration $S_5$, according to the present invention.

FIG. 2 is an illustration of example charged particle microscope system(s) 200 for inspection of a component of a sample 202 whose optical column includes a corrector system 100 for correcting the two-fold, fifth-order aberration $S_5$, according to the present invention. The example charged particle microscope system(s) 200 may include electron microscope (EM) setups or electron lithography setups that are configured to irradiate and/or otherwise impinge the sample 202 with a beam of electrically charged particles 204 (usually an electron beam or an ion beam). In various embodiments the charged particle microscope system 200 may be or include one or more different types of EM and/or charged particle microscopes, such as, but not limited to, a scanning electron microscope (SEM), a scanning transmission electron microscope (STEM), a transmission electron microscope (TEM), a charged particle microscope (CPM), dual beam microscopy system, etc. Additionally, in some embodiments a TEM is capable of operating as a STEM as well. FIG. 2 shows the example charged particle microscope system(s) 200 as being a STEM system 206.

The example charged particle microscope system(s) 200 includes a charged particle source 208 (e.g., a thermal electron source, Schottky-emission source, field emission source, a liquid metal ion source, a plasma ion source, etc.) that emits the charged particle beam 204 along an emission axis 210 and towards an accelerator lens 212. The emission axis 210 is a central axis that runs along the length of the example charged particle microscope system(s) 200 from the charged particle source 208 and through the sample 202.

The accelerator lens 212 accelerates/decelerates, focuses, and/or directs the charged particle beam 204 towards a focusing column 214. The focusing column 214 focuses the charged particle beam 204 so that it is incident on sample 202. Additionally, the focusing column 214 corrects and/or tunes aberrations (e.g., geometric aberrations, chromatic aberrations) of the charged particle beam 204. In FIG. 2, the focusing column 214 is illustrated as including the corrector system 100 according to the present invention, a transfer lens 218, and an objective lens 220. The corrector system 100 includes a first corrective component 102 and a second corrective component 104 that generate fields that contribute to a two-fold, fifth-order aberration $S_5$. In some embodiments, the first corrective component 102 and the second corrective component 104 are each component elements of a spherical aberration corrector. Alternatively, in some embodiments the first corrective component 102 may be a component element of a spherical aberration corrector while the second corrective component 104 is positioned downstream of the spherical aberration corrector. In either embodiment, the spherical corrector may generate a negative Cs. The corrector system 100 is also shown as including a quadrupole lens 112 positioned and/or otherwise configured so that it generates a two-fold, fifth-order aberration $S_5$ that combine with the aberration generated by the first corrective component 102 and the second corrective component 104 to correct the two-fold, fifth-order aberration $S_5$ in the charged particle microscope system(s) 300. In many implementations, the parasitic two-fold, fifth order aberration may be at least partially caused by mechanical errors in such a spherical aberration corrector. FIG. 2 illustrates the quadrupole lens 112 as being positioned at an axial crossover of the charged particle beam 204.

The objective lens 220 is an optical element that focuses the charged particle beam 204 to a point on the sample 202. The objective lens 220 generates a positive Cs. The objective lens 220 may comprise a single-polepiece lens, a magnetic electrostatic compound lens, electrostatic detector objective lens, or another type of objective lens.

FIG. 2 further illustrates the example charged particle microscope system(s) 200 as including a sample holder 222 that holds the sample 202. The example charged particle microscope system(s) 200 is also shown as including a detector 224 that is configured to detect charged particles 226 that pass through the sample 202 as a result of the charged particle beam 204 being incident on the sample 202. In addition, the example charged particle microscope system(s) 200 is illustrated as including astigmatism correction and scan coils 228 for causing the charged particle beam 204 to scan the surface of the sample 202. For example, by operating scan coils 228, the direction of the charged particle beam 204 may be shifted so that it strikes a different location of the sample 202. The example charged particle microscope system(s) 200 further includes one or more projection lenses 230 positioned between the sample 202 and the detector 224.

FIG. 2 further shows example charged particle microscope system(s) 200 as optionally including a computing device(s) 232. Those skilled in the art will appreciate that the computing devices 232 depicted in FIG. 2 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 232 may also be connected to other devices that are not illustrated, or instead may operate as a stand-alone system.

Figure 3:
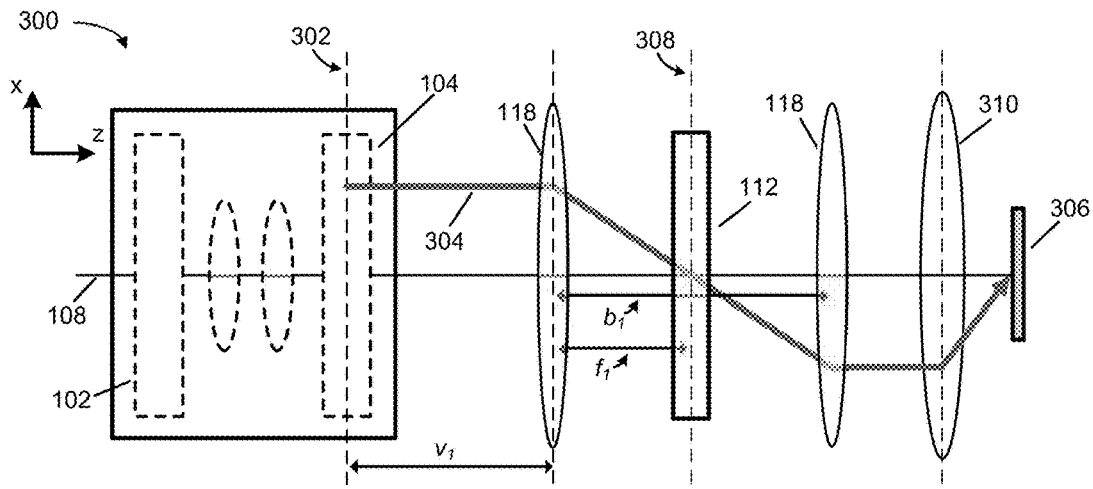
FIG. 3 illustrates a schematic layout of corrector systems according to the present disclosure having the quadrupole lens positioned at an axial crossover of the charged particle beam.

FIG. 3 illustrates a schematic layout of corrector systems according to the present disclosure having the quadrupole lens positioned at an axial crossover of the charged particle beam. FIG. 3 shows corrector systems 100 that comprises a first corrective component 102, a second corrective component 104, and an intermediate multipole 116. In the embodiment depicted in FIG. 3 the second corrective component 104 is positioned at a plane 302. FIG. 3 shows an axial ray 304 of a charged particle beam that is emitted along the central axis 108 towards sample 306. Specifically, FIG. 3 illustrates the axial ray 304 exiting the plane 302 toward a transverse lense(s) 118 that magnifies the charged particle beam. The quadrupole lens 112 is shown as being positioned in a plane 308 that includes an axial crossover of the charged particle beam. An objective lens 310 is further depicted as magnifying the charged particle beam onto the sample 306. FIG. 3 illustrates each of the first corrective component 102 and the second corrective component 104 as being components within a Rose hexapole corrector. However, in other embodiments a different type of spherical aberration correction system may be used. Moreover, as discussed above, in other embodiments one or both of the first corrective component 102 and the second corrective component 104 may be separate from the spherical aberration correction system.

Figure 4:
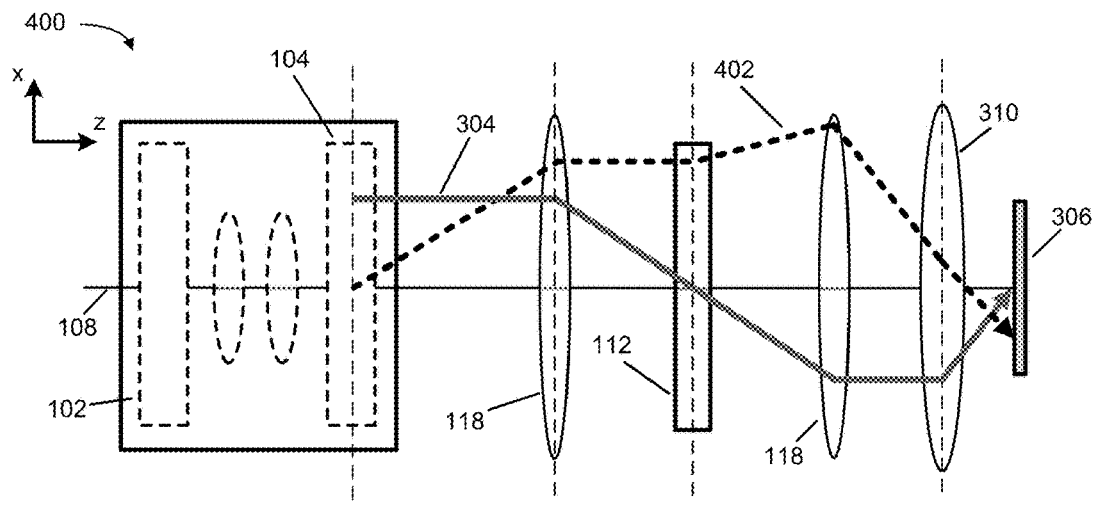
FIGS. 4 and 5 illustrate the optical behavior of corrector systems according to the present disclosure having the quadrupole lens positioned at an axial crossover of the charged particle beam.
Figure 5:
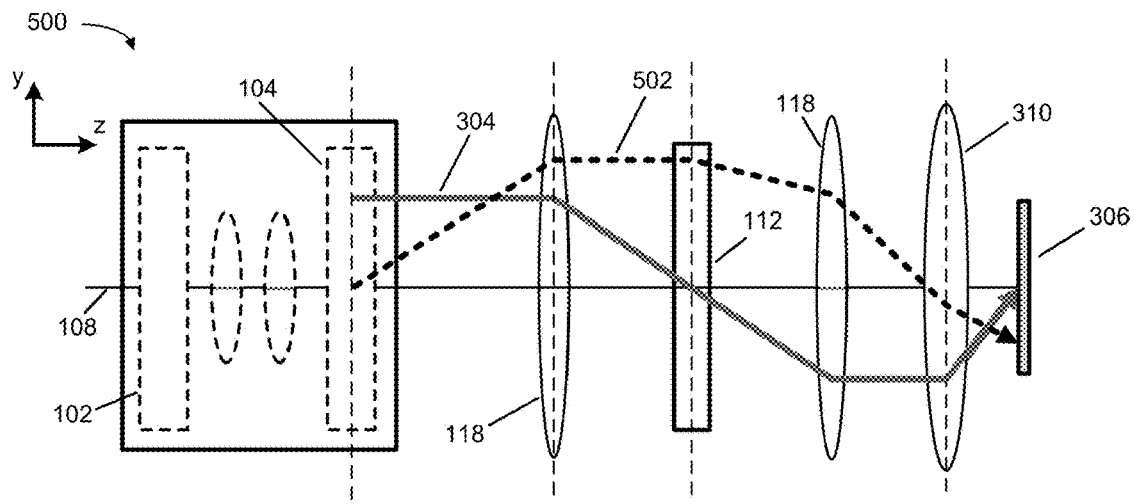

FIGS. 4 and 5 are diagrams that illustrate the optical behavior of corrector systems according to the present disclosure having the quadrupole lens positioned at an axial crossover of the charged particle beam. Specifically, FIGS. 4 and 5 illustrate the optical behavior of the corrector systems in the xy-plane and the yz-plane, respectively.

For example, FIG. 4 shows the quadrupole lens 112 as being positioned and excited so as to generate a field that applies a negative lensing effect in the xz-plane. This lensing effect beam is shown in FIG. 4 by field ray 402. Alternatively, FIG. 5 shows the quadrupole lens 112 as being positioned and excited such that the field that it generates positively magnifies the charged particle beam in the yz-plane. This lensing effect is shown in FIG. 5 by field ray 502. In this way, because the quadrupole lens 112 acts as a positive lens in one axial direction and a negative lens in a perpendicular axial direction, the quadrupole lens 112 causes the correction of the two-fold, fifth-order two-lobe $S_5$ aberration. This is a so-called combination aberration. A more familiar combination aberration is C5 (5th order, cylindrically symmetric), which would be generated if a round lens would replace the quadrupole lens 112. Moreover, because the quadrupole lens is positioned at an axial crossover of the charged particle beam, the field it generates has a negligible effect on (and thus does not generate) a two-fold, first-order aberration $A_1$ and/or a two-fold, third-order aberration $S_3$.

Figure 6:
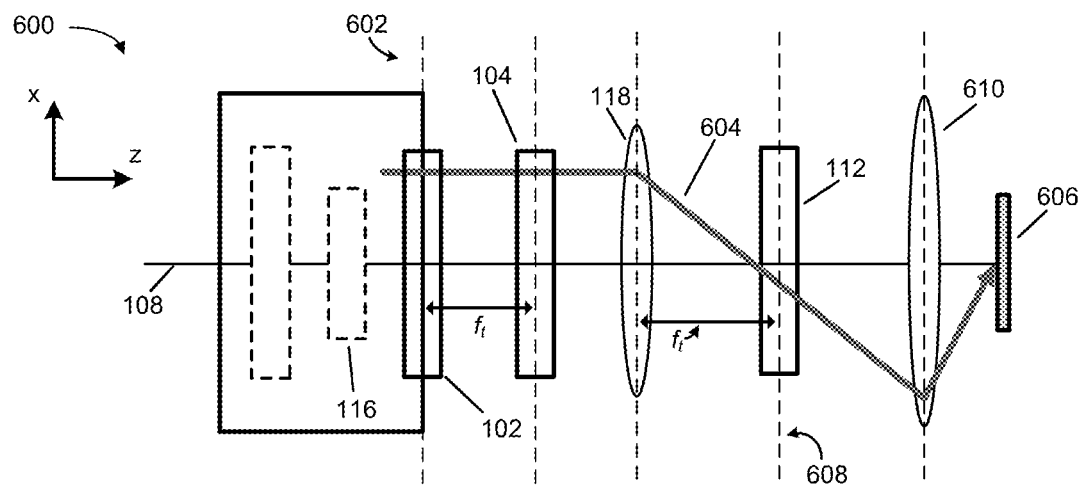
FIG. 6 illustrates a schematic layout of corrector systems according to the present disclosure where the quadrupole lens is not positioned at an axial crossover of the charged particle beam.

FIG. 6 illustrates a schematic layout of corrector systems according to the present disclosure where the quadrupole lens is not positioned at an axial crossover of the charged particle beam. FIG. 6 shows a corrector system that comprises a first corrective component 102 and a second corrective component 104. In the embodiment depicted in FIG. 6 the first corrective component 102 is positioned at a plane 602. FIG. 6 shows an axial ray 604 of a charged particle beam that is emitted along the central axis 108 towards sample 606. Specifically, FIG. 6 illustrates the axial ray 604 exiting the plane 602 toward a transverse lense(s) 118 that magnifies the charged particle beam. The quadrupole lens 112 is shown as being positioned in a plane 608 that does not include an axial crossover of the charged particle beam 604. An objective lens 610 is further depicted as magnifying the charged particle beam onto the sample 606.

Examples of inventive subject matter according to the present disclosure are described in the following enumerated paragraphs.

A1. A correction system for correcting fifth-order, two-fold aberrations in a charged particle system, the correction system comprising: a first corrective component that generates a first quadrupole field when a first excitation is applied to the first corrective component; a second corrective component that generates a second quadrupole field when a second excitation is applied to the second corrective component, wherein the second corrective component is positioned between the first corrective component and a sample when used in the charged particle system; and a quadrupole that generates a third quadrupole field when a third excitation is applied to the quadrupole, wherein the quadrupole is positioned between the second corrective component and the sample when used in the charged particle system, and the third quadrupole field, in combination with at least the first quadrupole field and the second quadrupole field, corrects the fifth-order, two-fold aberration when the charged particle system is in use.

A1.1. The correction system of paragraph A1, wherein the first corrective component and the second corrective component are component elements of a spherical aberration corrector.

A1.2. The correction system of paragraph A1, wherein the first corrective component is a component element of a spherical aberration corrector, and the second corrective component is positioned downstream of the spherical aberration corrector.

A1.3. The correction system of any of paragraphs A1.1-A1.2, wherein the spherical aberration corrector generates a negative $C_S$, and when used in a charged particle microscope system the quadrupole is positioned between the spherical aberration corrector and an objective lens that generates a positive $C_S$.

A1.4. The correction system of any of paragraphs A1-A.1.3, wherein the fifth-order, two-fold aberrations is at least partially caused by one or more mechanical errors in the first corrective component, the second corrective component, and/or the spherical aberration corrector.

A1.5. The correction system of any of paragraphs A1-A.1.4, wherein the spherical aberration corrector is a Cs+Cc−corrector.

A2. The correction system of paragraph A1, wherein the first quadrupole field and the second quadrupole field at least partially generate the fifth-order, two-fold aberration.

A2.1. The correction system of paragraph A2, wherein the third excitation is tuned such that the third quadrupole field generates a complimentary fifth-order, two-fold aberration, and wherein the complimentary fifth-order, two-fold aberration combines with the fifth-order, two-fold aberration generated at least in part by the first quadrupole field and the second quadrupole field such that the fifth-order, two-fold aberration is corrected in the charged particle system.

A3. The correction system of any of paragraphs A1-A2.1, wherein the quadrupole lens is positioned at an axial crossover of a charged particle beam.

A3.1. The correction system of paragraph A3, wherein because the quadrupole is positioned at the axial crossover of the charged particle beam it does not generate a two-fold, first-order aberration A1.

A3.2. The correction system of paragraph A3, wherein because the quadrupole is positioned at the axial crossover of the charged particle beam it does not generate a two-fold, third-order aberration S3.

A3.3. The correction system of any of paragraphs A3-A3.2, wherein because the quadrupole is positioned at the axial crossover of the charged particle beam it generates a negligible two-fold, first-order aberration A1.

A3.4. The correction system of any of paragraphs A3-A3.2, wherein because the quadrupole is positioned at the axial crossover of the charged particle beam it generates a negligible two-fold, third-order aberration S3.

A4. The correction system of any of paragraphs A1-A3.4, wherein the quadrupole lens is not positioned at an axial crossover of a charged particle beam.

A4.1. The correction system of paragraph A4, wherein because the quadrupole is not positioned at the axial crossover of the charged particle beam it generates a two-fold, first-order aberration A1.

A4.2. The correction system of paragraph A4, wherein because the quadrupole is not positioned at the axial crossover of the charged particle beam it generates a two-fold, third-order aberration S3.

A4.3 The correction system of paragraph A4, wherein because the quadrupole is not positioned at the axial crossover of the charged particle beam it generates a two-fold, first-order aberration A1 and a two-fold, third-order aberration S3.

A4.4. The correction of any of paragraphs A4-A4.3, wherein at least one of the first corrective component and the second corrective component are positioned, excited, or otherwise configured such that the first quadrupole field and the second quadrupole field at least partially generate a complimentary two-fold, first-order aberration.

A4.4.1. The correction system of paragraph A4.4, wherein the complimentary two-fold, first-order aberration combines with the two-fold, first-order aberration generated by the quadrupole such that the two-fold, first-order aberration is corrected in the charged particle system.

A4.5. The correction system of any of paragraphs A4-A4.4.1, wherein at least one of the first corrective component and the second corrective component are positioned, excited, or otherwise configured such that the first quadrupole field and the second quadrupole field at least partially generate a complimentary two-fold, third-order aberration.

A4.5.1. The correction system of paragraph A5, wherein the complimentary two-fold, third-order aberration combines with the two-fold, third-order aberration generated by the quadrupole such that the two-fold, third-order aberration is corrected in the charged particle system.

A5. The correction system of any of paragraphs A1-A4.5.1, wherein the quadrupole lens is a two-fold stigmator.

A6. The correction system of any of paragraphs A1-A5, wherein the first corrective component and the second corrective component are quadrupoles.

A7. The correction system of any of paragraphs A1-A6, wherein the first corrective component and the second corrective component are two-fold stigmators.

A8. The correction system of any of paragraphs A1-A7, wherein the first quadrupole filed is a rotatable quadrupole field.

A9. The correction system of any of paragraphs A1-A8, wherein the second quadrupole field is a rotatable quadrupole field.

A10. The correction system of any of paragraphs A1-A9, wherein the quadrupole lens is imaged onto an objective lens when used in the charged particle system.

A11. The correction system of any of paragraphs A1-A10, wherein the quadrupole lens acts as a negative lens in a first plane, and acts as a positive lens in a second plane.

A11.1. The correction system of paragraph A11, wherein the first plane is perpendicular to the second plane.

A12. The correction system of any of paragraphs A1-A11.1, wherein the quadrupole changes the effective drift space between the second corrective component and the sample when used in the charged particle system.

A13. The correction system of any of paragraphs A1-A12, wherein the charged particle system is a charged particle microscope system.

A14. The correction system of any of paragraphs A1-A13, wherein the charged particle system is an electron microscope system.

B1. A correction system for correcting fifth-order, two-fold aberrations in a charged particle system, the correction system comprising: a spherical aberration corrector that generates a negative $C_S$, an objective lens that generates a positive $C_S$; and a quadrupole positioned between the spherical aberration corrector and the objective lens at an axial crossover of a charged particle beam, wherein the quadrupole generates a quadrupole field when an excitation is applied to the quadrupole, and wherein the quadrupole field corrects the fifth-order, two-fold aberration when the charged particle system is in use.

B1.1. The correction system of paragraph B1, wherein the fifth-order, two-fold aberrations is at least partially caused by one or more mechanical errors in the spherical aberration corrector.

B2. The correction system of paragraph B1, wherein the excitation is tuned such that the quadrupole field generates a complimentary fifth-order, two-fold aberration, and wherein the complimentary fifth-order, two-fold aberration combines with the fifth-order, two-fold aberration generated by other components of the charged particle system such that the fifth-order, two-fold aberration is corrected in the charged particle system.

B3. The correction system of any of paragraphs B1-B2, wherein the spherical aberration corrector is a Cs+Cc− corrector.

C1. A correction system for correcting fifth-order, two-fold aberrations in a charged particle system, the correction system comprising: a quadrupole that generates a quadrupole field when an excitation is applied to the quadrupole, wherein the quadrupole is positioned between the charged particle source and the sample, and the quadrupole field corrects the parasitic fifth-order, two-fold aberration in the charged particle microscope.

C2. The correction system of paragraph C1, wherein the optical column comprises a spherical aberration corrector and an objective lens that at least partially generate the parasitic fifth-order, two-fold aberration in the charged particle microscope.

C2.1. The correction system of paragraph C1, wherein the quadrupole is positioned between the spherical aberration corrector and the objective lens at an axial crossover of a charged particle beam; and the quadrupole generates a complimentary fifth-order, two-fold aberration that combines with the parasitic fifth-order, two-fold aberration to correct the parasitic fifth-order, two-fold aberration in the charged particle microscope.

C2.2. The correction system of any of paragraphs C2-C2.1, wherein the spherical aberration corrector generates a negative Cs, and the objective lens generates a positive Cs when the charged particle system is in use.

C3. The correction system of any of paragraphs C1-C2.2, wherein the quadrupole lens is not positioned at an axial crossover of the charged particle beam, and wherein because the quadrupole is not positioned at the axial crossover of the charged particle beam the quadrupole generates a two-fold, first-order aberration and a two-fold, third-order aberration.

C3.1. The correction system of paragraph C3, wherein the correction system further comprises: a first corrective component that generates a first quadrupole field when a first excitation is applied to the first corrective component; and a second corrective component that generates a second quadrupole field when a second excitation is applied to the second corrective component, wherein the second corrective component is positioned between the first corrective component and the quadrupole.

C3.1.1. The correction system of paragraph C3.1, wherein the first quadrupole field and the second quadrupole field at least partially generate: a complementary two-fold, first-order aberration that combines with the two-fold, first-order aberration generated by the quadrupole such that the two-fold, first-order aberration is corrected; and a complementary two-fold, third-order aberration that combines with the two-fold, third-order aberration generated by the quadrupole such that the two-fold, third-order aberration is corrected.

D1. A charged particle microscope comprising: a charged particle source configured to emit a charged particle beam toward a sample; an optical column configured to focus the charged particle beam onto the sample, wherein the optical column comprises the correction system of any of paragraphs A1-A14, B1-B3, or C1-C3.1.1.

E1. Use of the corrector of any of paragraphs A1-A14, B1-B3, or C1-C3.1.1.

F1. Use of the charged particle microscope of paragraph D1.

What is claimed is:

1. A correction system for correcting parasitic fifth-order, two-fold aberrations in a charged particle system, the correction system comprising:
   a first corrective component that generates a first quadrupole field when a first excitation is applied to the first corrective component;
   a second corrective component that generates a second quadrupole field when a second excitation is applied to the second corrective component, wherein the second corrective component is positioned between the first corrective component and a sample when used in the charged particle system; and
   a quadrupole that generates a third quadrupole field when a third excitation is applied to the quadrupole, wherein the quadrupole is positioned between the second corrective component and the sample when used in the charged particle system, and the third quadrupole field, in combination with at least the first quadrupole field and the second quadrupole field, corrects the parasitic fifth-order, two-fold aberration when the charged particle system is in use.

2. The correction system of claim 1, wherein the third quadrupole field generates a complimentary fifth-order, two-fold aberration.

3. The correction system of claim 2, wherein the third excitation is tuned such that the complementary fifth-order, two-fold aberration combines with the parasitic fifth-order, two-fold aberration such that the parasitic fifth-order, two-fold aberration is corrected in the charged particle system.

4. The correction system of claim 1, wherein the quadrupole lens is positioned at an axial crossover of a charged particle beam, and wherein because the quadrupole is positioned at the axial crossover of the charged particle beam, it does not generate a two-fold, first-order aberration or a two-fold, third-order aberration.

5. The correction system of claim 1, wherein the quadrupole lens is not positioned at an axial crossover of a charged particle beam, and wherein because the quadrupole is not positioned at the axial crossover of the charged particle beam it generates a two-fold, first-order aberration and a two-fold, third-order aberration.

6. The correction system of claim 5, wherein at least one of the first corrective component and the second corrective component are positioned, excited, or otherwise configured such that the first quadrupole field and the second quadrupole field at least partially generate a complementary two-fold, first-order aberration.

7. The correction system of claim 6, wherein the complementary two-fold, first-order aberration combines with the two-fold, first-order aberration generated by the quadrupole such that the two-fold, first-order aberration is corrected in the charged particle system.

8. The correction system of claim 7, wherein at least one of the first corrective component and the second corrective component are positioned, excited, or otherwise configured such that the first quadrupole field and the second quadrupole field at least partially generate a complementary two-fold, third-order aberration, and wherein the complementary two-fold, third-order aberration combines with the two-fold, third-order aberration generated by the quadrupole such that the two-fold, third-order aberration is corrected in the charged particle system.

9. The correction system of claim 1, wherein the first corrective component and the second corrective component are component elements of a spherical corrector.

10. The correction system of claim 1, wherein the first corrective component is a component element of a spherical aberration corrector, and the second corrective component is positioned between the quadrupole and the spherical aberration corrector.

11. The correction system of claim 1, wherein the first corrective component and the second corrective component are quadrupoles.

12. The correction system of claim 1, wherein the first quadrupole field and the second quadrupole field are rotatable quadrupole fields.

13. The correction system of claim 1, wherein the quadrupole lens acts as a negative lens in a first plane, and acts as a positive lens in a second plane, and wherein the first plane is perpendicular to the second plane.

14. The correction system of claim 1, wherein the quadrupole changes the effective drift space between the second corrective component and the sample when used in the charged particle system.

15. The correction system of claim 1, wherein the charged particle system comprises a spherical corrector configured to generate a negative $C_S$ and an objective lens that generates a positive $C_S$, and wherein the quadrupole is positioned between the spherical corrector and the objective lens.

16. A correction system for correcting fifth-order, two-fold aberrations in a charged particle system, the correction system comprising:
a spherical aberration corrector that generates a negative $C_S$, an objective lens that generates a positive $C_S$; and
a quadrupole positioned between the spherical aberration corrector and the objective lens at an axial crossover of a charged particle beam, wherein the quadrupole generates a quadrupole field when an excitation is applied to the quadrupole, and wherein the quadrupole field corrects the fifth-order, two-fold aberration when the charged particle system is in use.

17. A charged particle microscope comprising:
a charged particle source configured to emit a charged particle beam toward a sample;
an optical column configured to focus the charged particle beam onto the sample, wherein the optical column comprises a correction system configured to correct a parasitic fifth-order, two-fold aberration in the charged particle microscope, the correction system comprising:
a quadrupole that generates a quadrupole field when an excitation is applied to the quadrupole, wherein the quadrupole is positioned between the charged particle source and the sample, and the quadrupole field corrects the parasitic fifth-order, two-fold aberration in the charged particle microscope.

18. The charged particle microscope of claim 17, wherein:
the optical column comprises a spherical aberration corrector and an objective lens that at least partially generate the parasitic fifth-order, two-fold aberration in the charged particle microscope;
the quadrupole is positioned between the spherical aberration corrector and the objective lens at an axial crossover of a charged particle beam; and
the quadrupole generates a complimentary fifth-order, two-fold aberration that combines with the parasitic fifth-order, two-fold aberration to correct the parasitic fifth-order, two-fold aberration in the charged particle microscope.

19. The charged particle microscope of claim 17, wherein the quadrupole lens is not positioned at an axial crossover of the charged particle beam, and wherein because the quadrupole is not positioned at the axial crossover of the charged particle beam the quadrupole generates a two-fold, first-order aberration and a two-fold, third-order aberration.

20. The charged particle microscope of claim 19, wherein correction system further comprises:
a first corrective component that generates a first quadrupole field when a first excitation is applied to the first corrective component; and
a second corrective component that generates a second quadrupole field when a second excitation is applied to the second corrective component, wherein the second corrective component is positioned between the first corrective component and the quadrupole; and
wherein the first quadrupole field and the second quadrupole field at least partially generate:

a complementary two-fold, first-order aberration that combines with the two-fold, first-order aberration generated by the quadrupole such that the two-fold, first-order aberration is corrected; and a complementary two-fold, third-order aberration that combines with the two-fold, third-order aberration generated by the quadrupole such that the two-fold, third-order aberration is corrected.

* * * * *